United States Patent
Brinkman (10) Patent No.: US 8,299,819 B2
(45) Date of Patent: Oct. 30, 2012

(54) PEAK OR ZERO CURRENT COMPARATOR

(75) Inventor: Remco Brinkman, Deventer (NL)

(73) Assignee: ST-Ericsson SA, Plan-les-Ouates (CH)

( * ) Notice: Subject to any disclaimer, the term of this patent is extended or adjusted under 35 U.S.C. 154(b) by 412 days.

(21) Appl. No.: 11/913,594

(22) PCT Filed: Apr. 28, 2006

(86) PCT No.: PCT/IB2006/051326
§ 371 (c)(1),
(2), (4) Date: Jul. 2, 2008

(87) PCT Pub. No.: WO2006/117732
PCT Pub. Date: Nov. 9, 2006

(65) Prior Publication Data
US 2008/0290905 A1    Nov. 27, 2008

(30) Foreign Application Priority Data
May 4, 2005    (EP) .................................. 05103757

(51) Int. Cl.
*H03K 5/153*    (2006.01)
(52) U.S. Cl. .............. 327/77; 327/78; 327/86; 327/89
(58) Field of Classification Search .............. 327/77, 327/78, 89, 86
See application file for complete search history.

(56) References Cited

U.S. PATENT DOCUMENTS

| 6,084,439 A | 7/2000 | Sculley |
| 7,525,350 B2 * | 4/2009 | Zeng et al. .................. 327/78 |
| 2002/0145891 A1 | 10/2002 | Ling |

FOREIGN PATENT DOCUMENTS

EP    0430707 A2    6/1991

* cited by examiner

*Primary Examiner* — Kenneth B. Wells (57) ABSTRACT

The present invention relates to a simple and small-sized circuit configuration (10) for significantly reducing resettling time of a peak or zero current comparator. This circuit configuration (10) provides the comparator input stage with an alternative current path at the comparator input submitted to a large voltage variation able to disturb the DC-settings. This circuit configuration (10) comprises a pair of small transistors (P3, P4) coupled to a differential pair of transistors (N1, N2) of the comparator input stage and having a polarity different from said pair of transistors (P3, P4). The gates of the transistors P3 and P4 share a common terminal connected to said comparator input. The currents and voltages across the comparator are always maintained close to the normal DC-setting values during the voltage transition phase. This circuit configuration (10) can be used in any current comparator for detecting a peak or a zero current, in particular, in DC-DC converters based on a switched operating mode.

8 Claims, 10 Drawing Sheets

PEAK OR ZERO CURRENT COMPARATOR

The present invention relates to a comparator circuit, and more particularly to an input stage of a comparator circuit, for detecting a peak or zero current based on a switched operating mode of a converter circuit, in particular a DC-DC converter.

Regulated or controlled power supplies are found in virtually all electronic devices, including battery chargers, cellular telephones, computers, computer monitors, televisions, audio equipment and video cameras. A typical power supply is a converter, such as a direct current to direct current converter (in the following simply designated as DC-DC converter), which operates from a power source, generates an alternating signal as an intermediate process and delivers an output signal to a load. The DC-DC converter accepts a DC input voltage and produces a DC output voltage. Typically, the (mean) output voltage produced is at a higher or lower value than the input voltage according to whether a step-up (boost) or respectively a step-down (buck) DC-DC converter is used.

In DC-DC conversion, we often need a comparator in the DC-DC converter circuit to detect a peak current or a zero current so as to determine the most appropriate ON-OFF switching sequence. This sequence can be controlled by a driver circuit such as a digital controller based on the output signal of the comparator. The DC-DC converters usually use certain electrical components, such as an external inductor L to store electrical energy generated by a current flowing through it. These comparators must be accurate and fast to measure, under normal circumstances, small voltage differences between one of the two terminals (LXA, LXB) of the inductor L and another terminal of the DC-DC converter being able to be at a voltage potential $V_{ss}$, $V_{out}$ or $V_{bat}$ (if a battery is used as a voltage source). During this measuring phase, the voltage at the terminal of the inductor L concerned by the measurement must be pretty stable so that it varies only slowly with time and thus allows the comparator to operate inside its normal range.

However, just before the start of the measuring phase, this terminal makes a large shift $\Delta V$ from $V_{ss}$ to $V_{out}$ or vice versa when a step-up DC-DC converter and a large shift $\Delta V$ from $V_{ss}$ to $V_{bat}$ or vice versa when a step-down DC-DC converter is used. This large difference in voltage, which is applied to one of the inputs of the comparator, significantly disturbs the DC-settings of the comparator which cannot temporarily do any accurate and reliable measurement as long as the time to resettle has not passed. In this case, it would be possible to keep the comparator output reset using a latch circuit until the completion of the resettling time. However, the voltage variation $\Delta V$ with respect to the time is furthermore so fast or in other words, the slope $\Delta V/\Delta t$ is so steep, that this resettling time may be too long and make so that zero current detection comes too late.

Figure 1A:
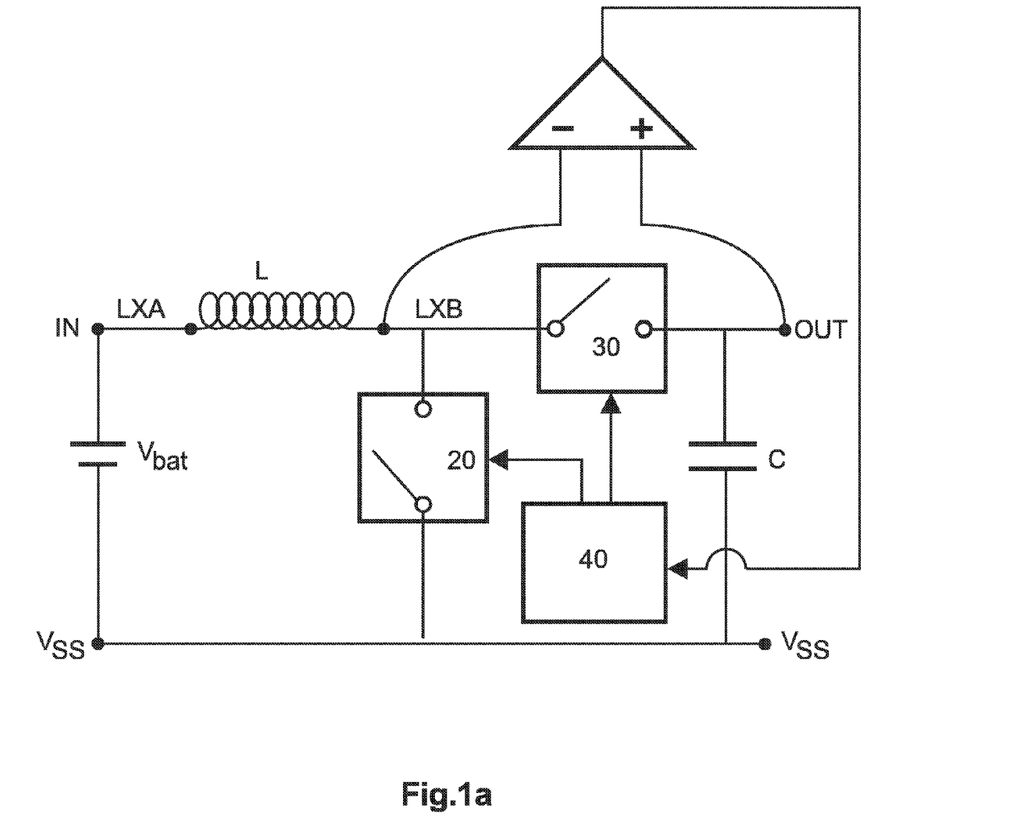
FIG. 1a shows a conventional synchronous step-up DC-DC converter circuit in association with a comparator for detecting a zero current.
Figure 1B:
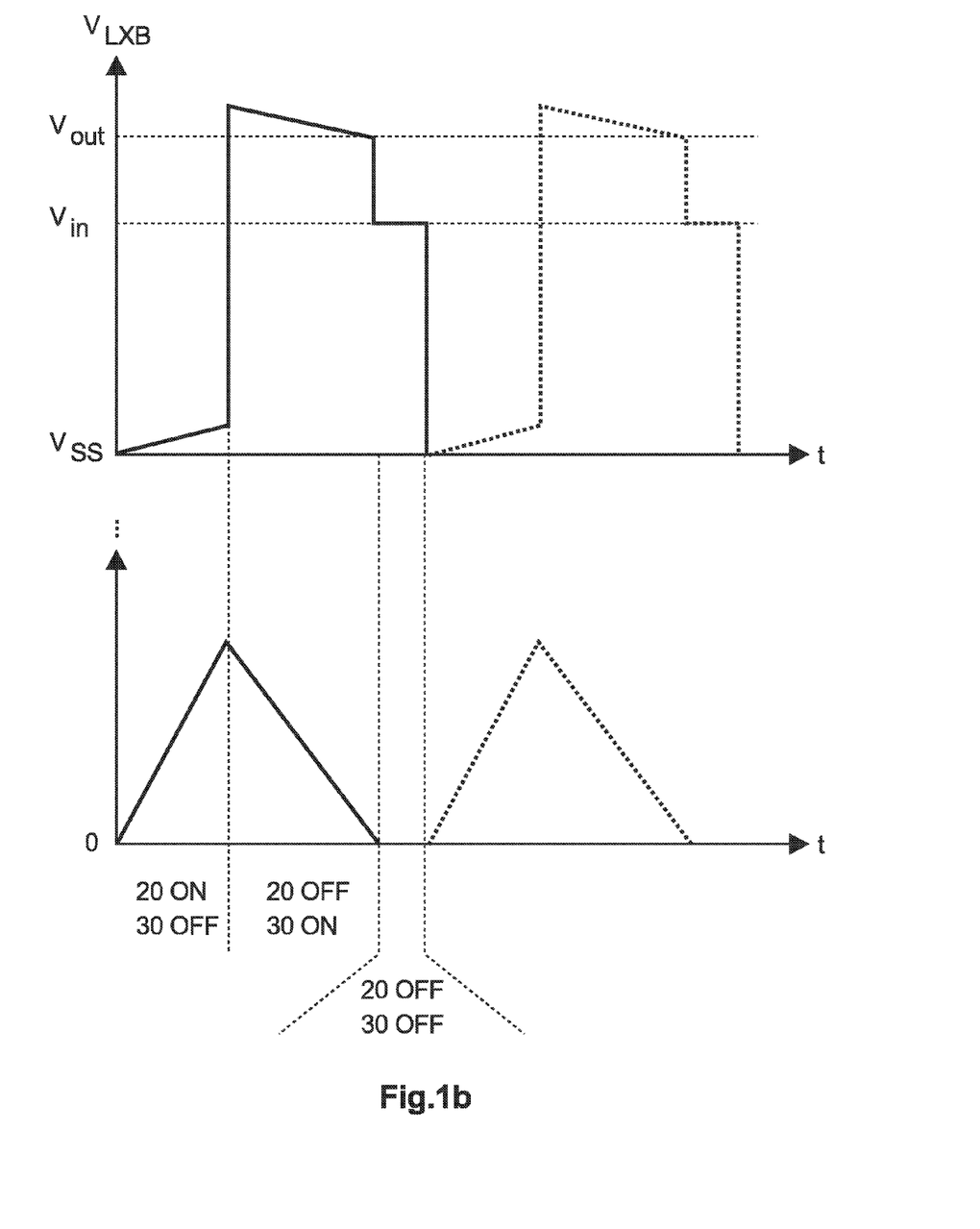
FIG. 1b shows the plots versus time of the voltage $V_{LXB}$ at the terminal LXB and the corresponding current.
Figure 2A:
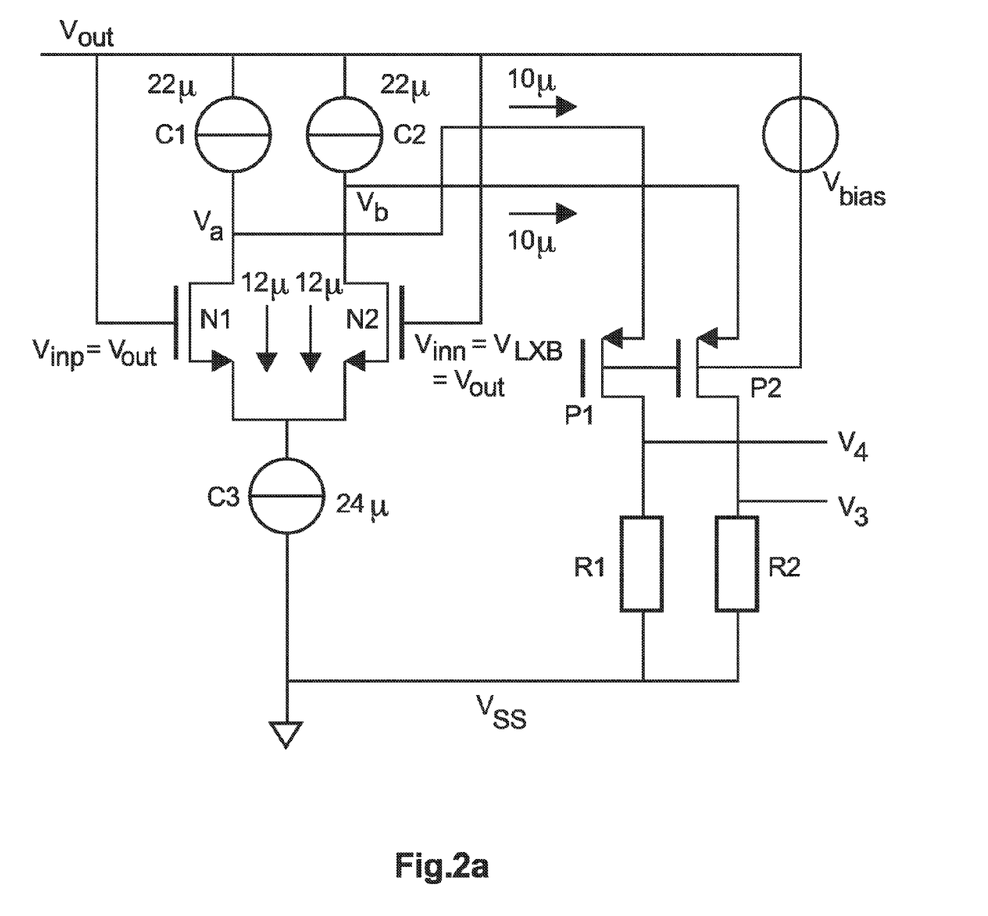
FIG. 2a shows the input structure of a conventional current comparator with a folded cascode configuration where $V_{inn}=V_{inp}=V_{out}$.
Figure 2B:
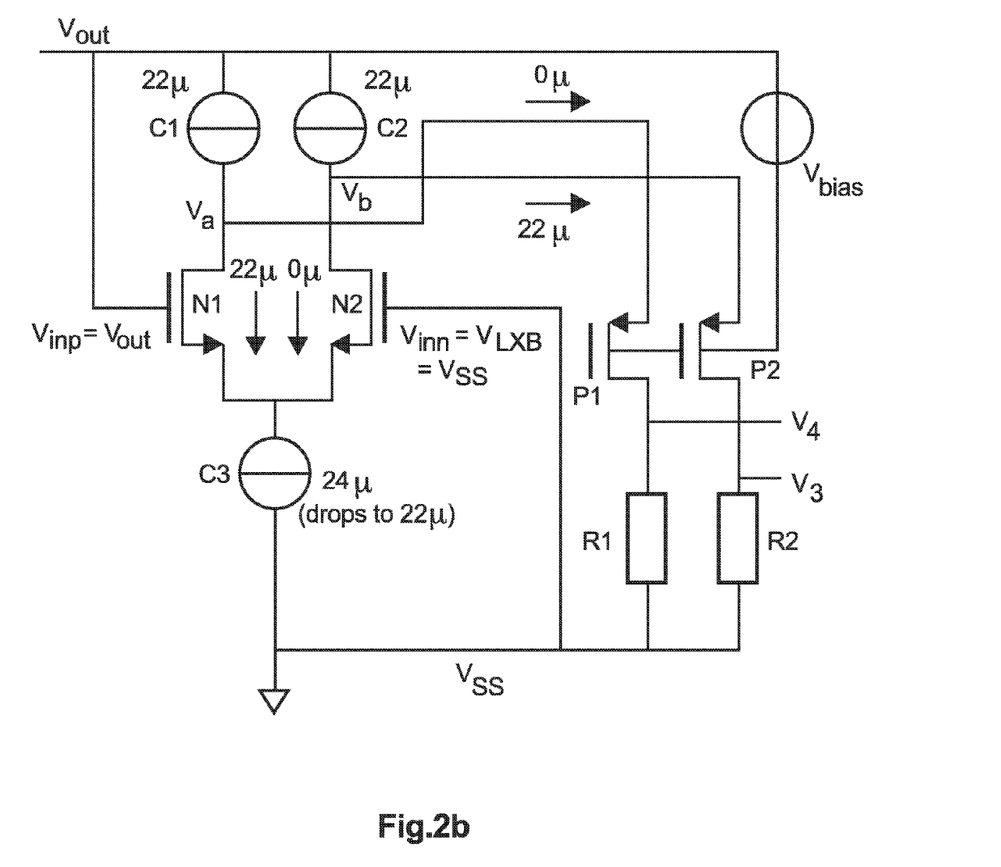
FIG. 2b shows the input structure of a conventional current comparator with a folded cascode configuration where $V_{inn}=V_{SS}$ and $V_{inp}=V_{out}$.

Such a situation can be better illustrated by referring to FIGS. 1a and 1b wherein, for example, a typical synchronous step-up DC-DC converter circuit with a conventional current comparator for measuring a zero current is depicted, and to FIG. 2 wherein an input structure of a conventional current comparator is shown.

In FIG. 1a, the step-up DC-DC converter circuit generates a regulated output voltage $V_{out}$ from a variable input voltage $V_{in}$ provided for example by a battery ($V_{bat}$) connected between the terminal LXA and the terminal at $V_{SS}$, and is characterized by the fact that $V_{out}$ can be higher than $V_{in}$. Furthermore, the output voltage $V_{out}$ is substantially constant, although the input voltage $V_{in}$ and the output load may change. Such a DC-DC converter, called also a switch-mode power supply, usually uses a switching device 20, which may be a power transistor (e.g. MOSFET, BJT) or any other controllable semiconductor switching device, and an external inductor L connected between the terminals LXA and LXB which stores energy in a magnetic field generated by a current flowing through the inductor L and avoids to short-circuit the input voltage when the switching device 20 is turned on. Although a diode D is usually connected in series with the inductor L in order to enable the energy stored in the inductor L to be transmitted as a current to the output load when the switching device 20 is turned off, it can be possible in a switch mode converter using a technique called "synchronous rectification" to replace the diode with an additional switching device 30. This substitution enables to improve efficiency of the converter while removing the threshold voltage of the diode. The two switching devices 20, 30 which are controlled by a driver circuit 40 such as digital controller monitoring the output signal of the comparator, now open and close in opposition to each other, directing the current to either charge the inductor or to feed the output load.

In FIG. 1b, a complete operating cycle of the synchronous step-up DC-DC converter is described with its three phases which allow to follow the evolution of the voltage $V_{LXB}$ at the terminal LXB, in which the output voltage $V_{out}$ is the voltage at an external output filtering capacitor C connected in parallel to the output load and a current comparator is connected between the terminals LXB and OUT.

In the up phase, the switching device 20 (e.g. a N-channel MOS transistor) which is connected between the terminal LXB and the terminal at $V_{SS}$ is switched on whereas the additional switching device 30 (e.g. a P-channel MOS transistor) which is connected between the terminals LXB and OUT is switched off, such that the current I increasingly flows through the inductor L and the switching device 20 until the desired peak value is reached. Thus, the additional switching device 30 serves to provide a decoupling between the output and the switching device 20, such that the voltage $V_{LXB}$ equals to $V_{SS}$.

In the forward phase, the switching device 20 is switched off and the additional switching device 30 is switched on such that the current I now flows through the inductor L and the capacitor C which stores the corresponding charge while decreasing from the desired peak value to zero. Thus, this decrease induces a negative voltage drop across the inductor L such that the output voltage $V_{out}$ is boosted relative to the input voltage $V_{in}$ and the voltage $V_{LXB}$ rises up to $V_{out}$ or slightly above as this may happen for a very short time during the steep transition from the up phase to the forward phase where the switching device 30 delays to switch on such that both switching devices 20, 30 are non-conducting.

In the third phase, the switching device 30 is again switched off whereas the switching device 20 delays to switch on so that both switching devices 20, 30 are turned off. Thus, the voltage $V_{LXB}$ drops from $V_{out}$ to $V_{in}$. When the switching device 20 is again on, a new operating cycle can start.

In FIGS. 2a and 2b, the input structure of a conventional current comparator with a folded cascode configuration for measuring a zero current in a step-up DC-DC converter is depicted. This input structure consists of two stages, an input stage and a folded cascode stage, which enables to strongly reduce the Miller capacitance effect. The input stage contains two input terminals, INN connected to the terminal LXB from the step-up DC-DC converter and INP connected to the terminal OUT from the same converter, a differential amplifier which comprises a differential pair of transistors (N1, N2) illustrated as N-channel MOS transistors, two active loads illustrated as high output impedances of two P-channel MOS transistors working as two constant-current sources (C1, C2), and a bias-current source (C3) collecting the drain currents of the two transistors N1 and N2 for generating a fixed tail current. The folded cascode stage, fed with current by the differential output of the input stage at the potential nodes $V_a$ and $V_b$, includes a pair of transistors (P1, P2) illustrated as p-channel MOS transistors, two load resistors (R1, R2) providing respectively two voltages $V_4$ and $V_3$ which are forwarded to a track-and-latch stage (not represented here) so as to obtain a Rail-to-Rail™ voltage, and a bias-voltage source ($V_{bias}$) maintaining the source voltages of the transistors P1 and P2 at $+/-V_{out}-300$ mV so as to keep the transistors N1 and N2 always saturated even if the inputs INN and INP are at $V_{out}$ or slightly above. Referring to FIG. 2a, when $V_{inn} \approx V_{inp}$, we get the situation corresponding to the forward phase of the step-up DC-DC converter where $V_{LXB} \approx V_{out}$. The comparator has its normal DC settings. The currents from the sources C1 and C2 are chosen identical and split between identical currents flowing through the transistors N1 and N2 and other identical currents flowing through P1 and P2. Referring to FIG. 2b, when $V_{inn}$ is equal or close to $V_{ss}$, we get the situation corresponding to the up phase of the step-up DC-DC converter where $V_{LXB}=V_{SS}$. Here, the normal DC bias settings of the comparator are completely disturbed since $V_{LXB}$ switches off the transistor N2. When $V_{LXB}$ rises up to $V_{out}$ or slightly above again, the transistor N2 switches on and at the same time, the comparator can start to resettle to current and voltage values that are close to the DC settings with $V_{inn} \approx V_{inp}$. However, the effective resettling time does not start as soon as the switching device 30 is turned on, but as soon as the voltage $V_{LXB}$ returns to a stable value equal or close to $V_{out}$. During the resettling time, no accurate and reliable measurement can be carried out. Furthermore, in practical cases, this time is too long to be acceptable since zero current detection may come within this resettling time.

Figure 3:
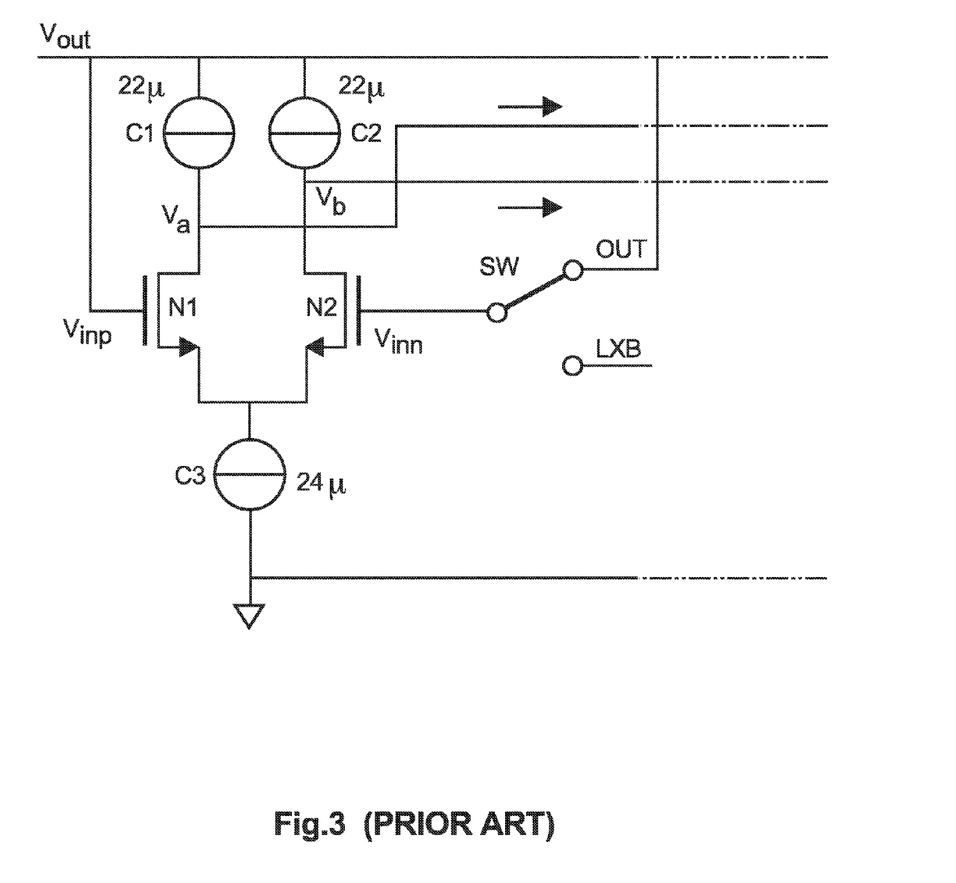
FIG. 3 shows the input stage of a conventional current comparator with a prior art solution using a switch for minimizing the resettling time of the comparator.

FIG. 3 depicts the prior art solution to overcome this problem, which consists of maintaining the negative input INN of the comparator at a potential always equal or close to the potential of the terminal OUT to which the positive input INP of the comparator is connected. This can be realized by implementing a switch SW (e.g. a P-channel MOS transistor) which deconnects INN from LXB as soon as $V_{LXB}$ drops below a predefined level, for instance 500 mV below $V_{out}$, in order to reconnect it to the terminal OUT. However, this solution offers several drawbacks. The first disadvantage of using a switch in series with the input of the comparator is the insertion of a supplementary series resistance which together with the input capacitance of the comparator causes a RC-combination that will increase the response time. The second disadvantage concerns the insertion of a supplementary driver circuit to control the switch, which can make the standard circuit configuration more complex and also more bulky when the increase in size of the switch is needed to significantly minimize the effects of its series resistance.

It is therefore an object of the present invention to provide a simple and small-sized circuit configuration for the input stage of a peak or zero current comparator in order to have short resettling time when used, in particular, in a DC-DC converter based on a switched operating mode. Thus, the comparator can be ready to perform measurement as soon as the measuring phase has started.

This object is achieved by a circuit configuration as claimed in claim 1, a comparator input stage as claimed in claim 6, a comparator means as claimed in claim 7, and a detector means as claimed in claim 8.

Accordingly, a comparator input stage, comprising a differential pair of transistors and an additional pair of transistors with a polarity reverse of said differential pair, is arranged so that the current which flows through the input stage is never interrupted owing to an alternative path for the current when a transistor is switched off. Thereby, the DC-settings of the comparator can stay close to the normal DC values for which a symmetrical current flows through each branch of the input stage, and the time needed to resettle can be thus significantly reduced.

This arrangement, which consists of coupling said additional pair of transistors to said differential pair of transistors enables to have a very simple circuit configuration.

Moreover, the comparator input stage is arranged with an additional pair of small-sized transistors. This additional pair thus requires no supplementary driver circuit such as used for controlling for example the ON-OFF sequence of a switch, and thereby takes up even little space.

Furthermore, both input terminals of the comparator input stage may be connected to the terminals from a DC-DC converter means based on a switched operating mode wherein a peak current or a zero current is to be detected. Thereby, one of the two input terminals may be submitted to a large potential variation relative to the remaining input terminal which is connected to a predetermined value. This large potential variation can switch off a transistor of the comparator input stage and disturb the DC-settings of the comparator. Nevertheless, said configuration circuit enables to strongly alleviate such a trouble.

The output of a detector means, for detecting a peak or zero current and which comprises a comparator means having such a circuit configuration at its input stage, may be used by a driver means for controlling the ON-OFF switching sequence of said DC-DC converter means.

Further advantageous developments are defined in the dependent claims.

The present invention will be now described based on preferred embodiments with reference to the accompanying drawings in which.

In the following, the first preferred embodiment will be described in connection with the input structure of a comparator detecting a zero current in a synchronous step-up DC-DC converter such as depicted in FIG. 1a.

Figure 4:
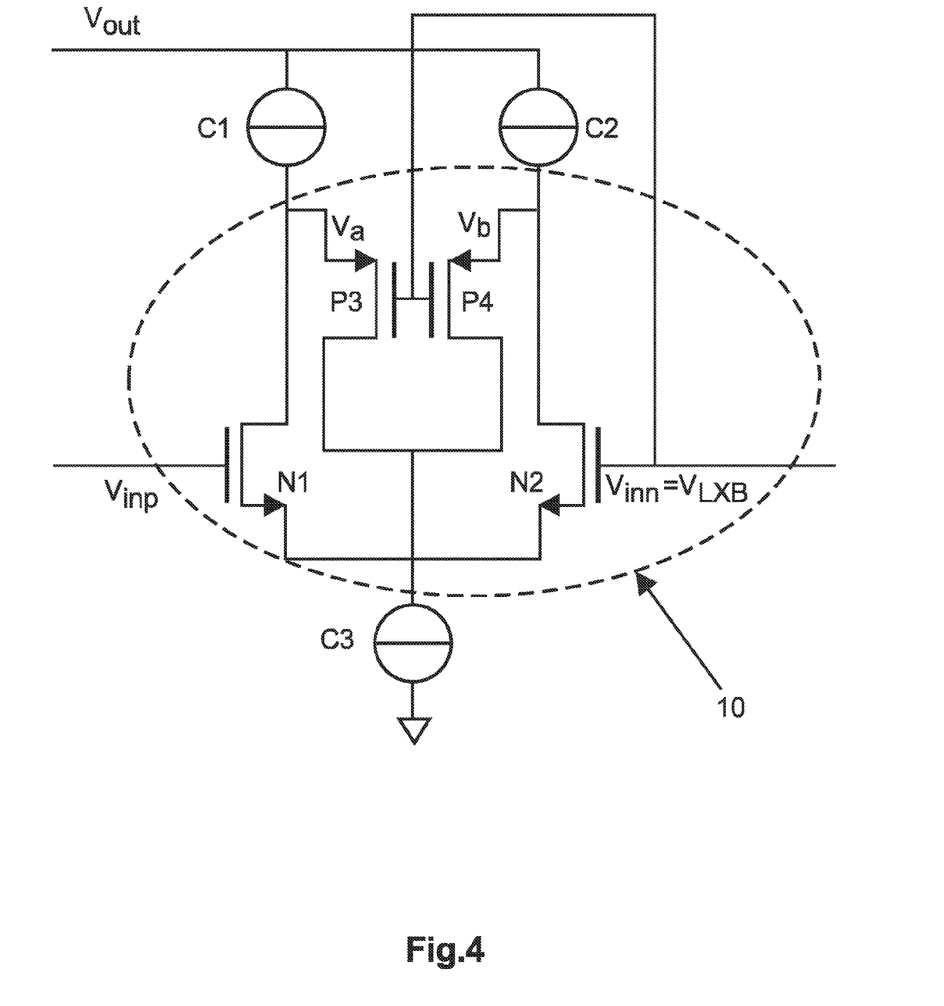
FIG. 4 shows the input stage of a current comparator according to the first preferred embodiment of the invention.

In FIG. 4, the input stage of a current comparator according to the first preferred embodiment of the invention is shown, consisting of a circuit configuration 10 including an additional pair of small P-channel MOS transistors, P3 and P4, separately connected between the drain and the source of each one of the N-channel MOS transistors N1 and N2 of the differential pair with a polarity different from said additional pair. The gates of the transistors P3 and P4 share a common terminal connected to the input of the comparator which is connected in our illustration to the terminal LXB of the step-up DC-DC converter and can be submitted to a large potential variation relative to the remaining input which is connected to a predetermined value. Thus, these gates will be at the same potential as the terminals LXB and INN of the input stage of the comparator. As soon as the potential of the terminal LXB drops below $V_{out}-300$ mV$-V_{Thp4}$ (Threshold voltage of P4), the transistor N2 switches off whereas the transistor P4 switches on and starts conducting. Therefore, the current can keep flowing even if the terminal LXB is at a low potential, just like in the situation where $V_{inn} \approx V_{inp}$. The transistor P4 such as configured in the circuit allows to create an alternative path for the current when the transistor N2 is switched off and to significantly minimize the disturbance of the DC-settings. The role of the transistor P3 is only to keep the comparator symmetrical. The outputs at the potentials $V_a$ and $V_b$ of the input stage of the comparator can now stay at a more or less constant potential when the terminal LXB is at a low potential. Furthermore, during the transition from the up phase to the forward phase, the comparator now needs much less time to resettle since the currents and voltages are already close to the normal DC values. The invention such as described according to the first preferred embodiment can be applied to detect a zero current in a step-up DC-DC converter (LXB, OUT) and also a peak current in a step-down DC-DC converter (LXB, OUT) wherein the battery ($V_{bat}$) is now located between the terminal OUT and the terminal at $V_{SS}$. After changing the polarity of the transistors P3, P4 of the invention from P-channel transistors into N-channel transistors, and in the same way, the polarity of all the components in the comparator, the invention such as described according to the first preferred embodiment can be also applied to a second preferred embodiment to detect a peak current in a step-up DC-DC converter (LXB, $V_{ss}$) and a zero current in a step-down DC-DC converter (LXB, $V_{ss}$).

Figure 5:
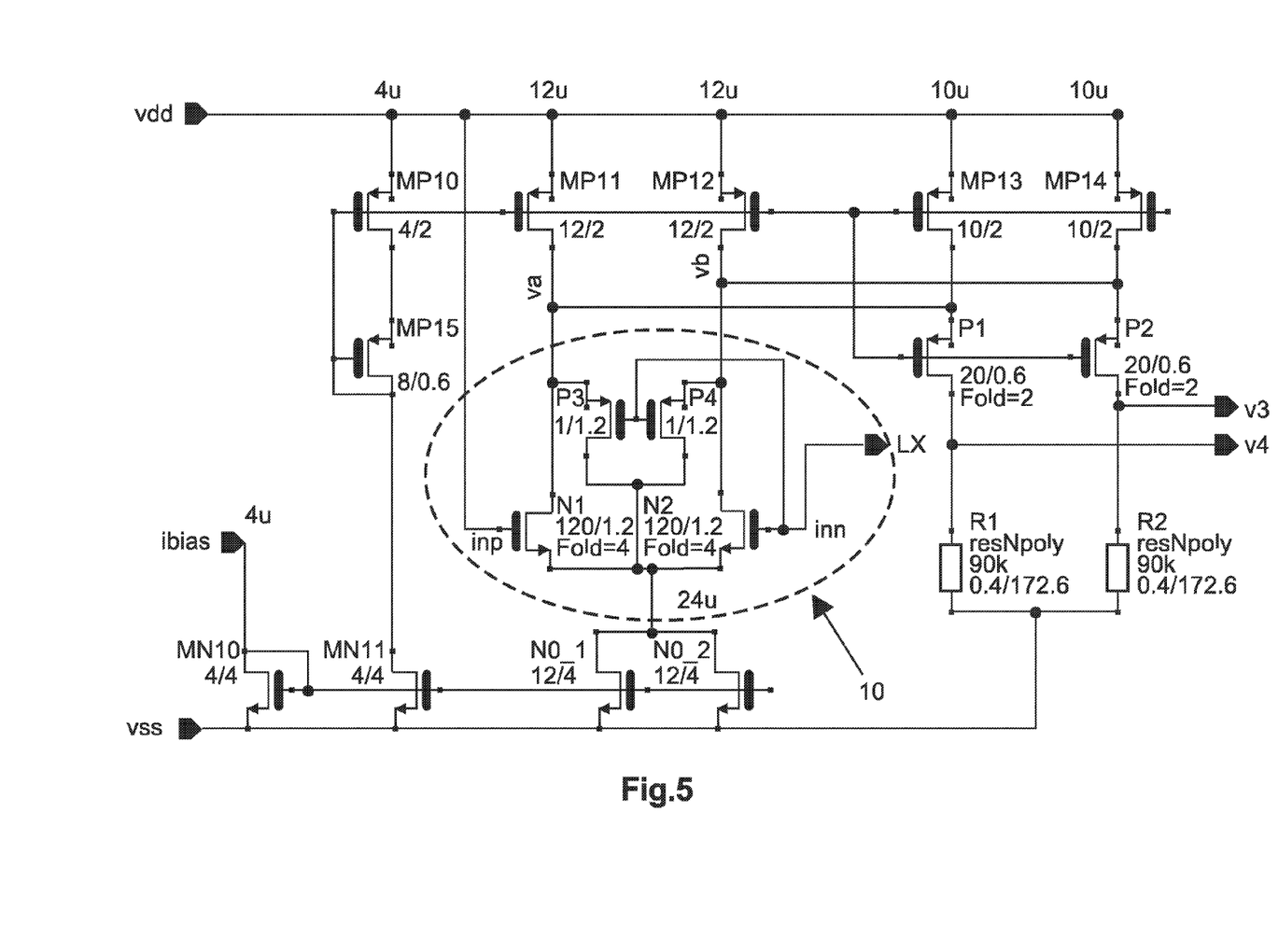
FIG. 5 shows the implementation of the first preferred embodiment of the invention in a comparator circuit simulating a real circuit.

In FIG. 5, the first preferred embodiment of the invention is shown in a comparator circuit simulating a real circuit. The two 22 μA current sources C1 and C2 are implemented here as (MP11, MP13) and (MP12, MP14). The split up shows us that the comparator circuit actually consists of two separate circuits: the input stage with 12 μA in both branches at $V_{inn}=V_{inp}$ and the folded cascode circuit with 10 μA in both branches. $V_{DD}$ and $V_{inp}$ are connected to the $V_{out}$ of the DC-DC converter such that the comparator measures around its own supply voltage $V_{DD}$. The output voltages V3 and V4 are forwarded to an amplifier and finally to a track-and-latch circuit (not represented here). The circuit simulation will be done using SPECTRE.

Figure 6:
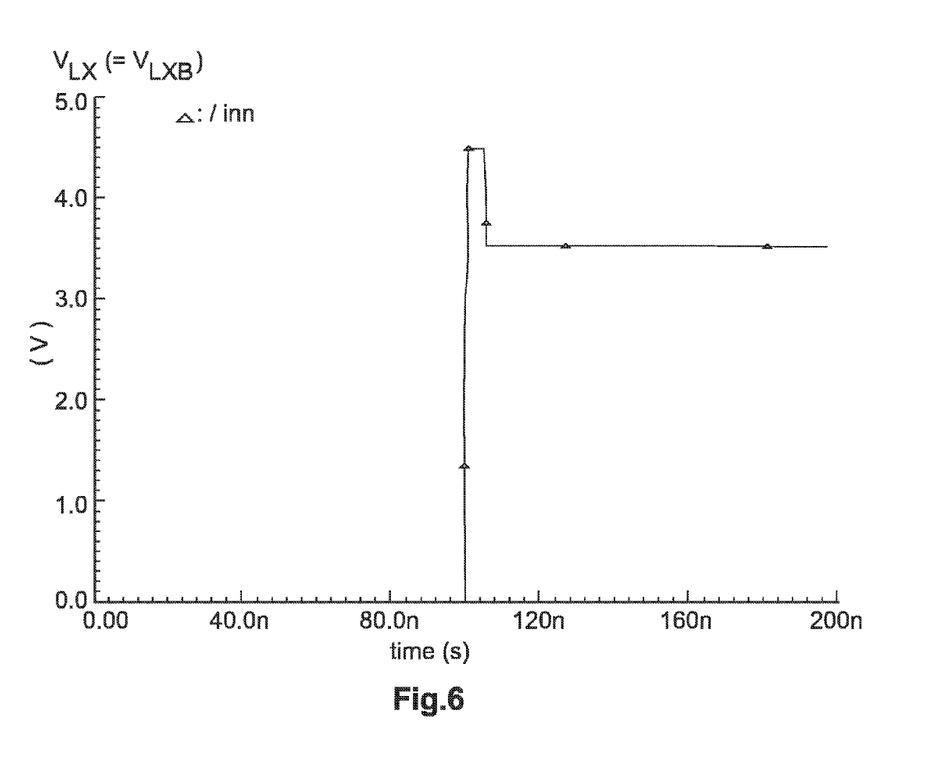
FIG. 6 shows the definition of the voltage $V_{LX}=V_{LXB}$ used in the simulation of a real comparator circuit.
Figure 7A:
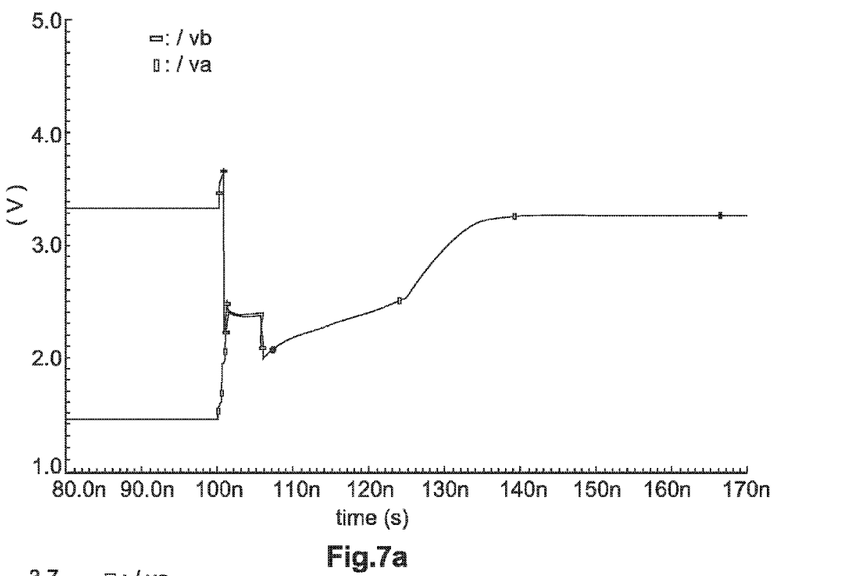
FIG. 7a shows the simulation results for the voltages $V_a$ at $V_b$ at the output of the input stage of the comparator when the first preferred embodiment of the invention is not implemented.
Figure 7B:
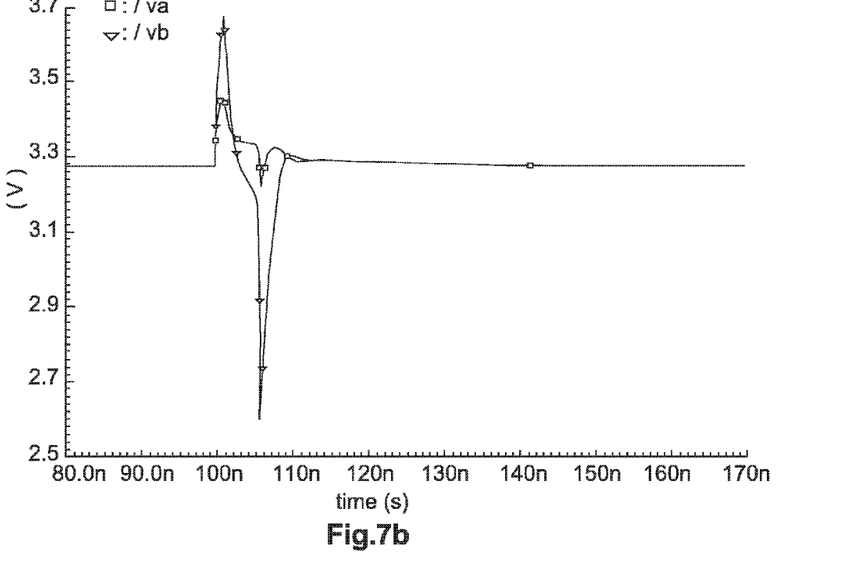
FIG. 7b shows the simulation results for the voltages $V_a$ at $V_b$ at the output of the input stage of the comparator when the first preferred embodiment of the invention is implemented.

As depicted in FIG. 6, the voltage $V_{LX}$ (=$V_{LXB}$) will be defined as a voltage step set equal to 0 Volt during 100 ns and then rising with a steep front from 0 up to 3.6 Volt (=$V_{DD}$), as this actually happens at the transition from the up phase to the forward phase. As aforementioned, a current peak usually appears for a very short time during the sharp transition from the up phase to the forward phase when both switching devices 20, 30 are non-conducting. If for example the switching device 30 is referred to as a P-channel MOS transistor, the current then finds its way through the body-diode of this transistor. Here, the peak value will be set equal to 4.6 Volt during 5 ns.

In the following FIGS. 7a-7b and FIGS. 8a-8b, simulation results given by time plots of the voltages $V_a$, $V_b$, $V_3$ and $V_4$ will be depicted with and without the presence of the invention, so as to demonstrate that the comparator resettles more quickly when the invention is implemented in the comparator input stage. The sooner the corresponding voltage nodes return to their stable DC-settings the sooner the comparator is resettled after a transition on LX (=LXB) from $V_{SS}$ level to $V_{DD}$ level.

These simulation results show us that the voltages return back to normal DC-settings much faster in the situation with P3 and P4. The comparison between FIG. 7a and FIG. 7b reveals that the potential nodes at $V_a$ and $V_b$ need a resettling time of about 35 ns without P3 and P4, which can be reduced to only 15 ns with P3 and P4.

Figure 8A:
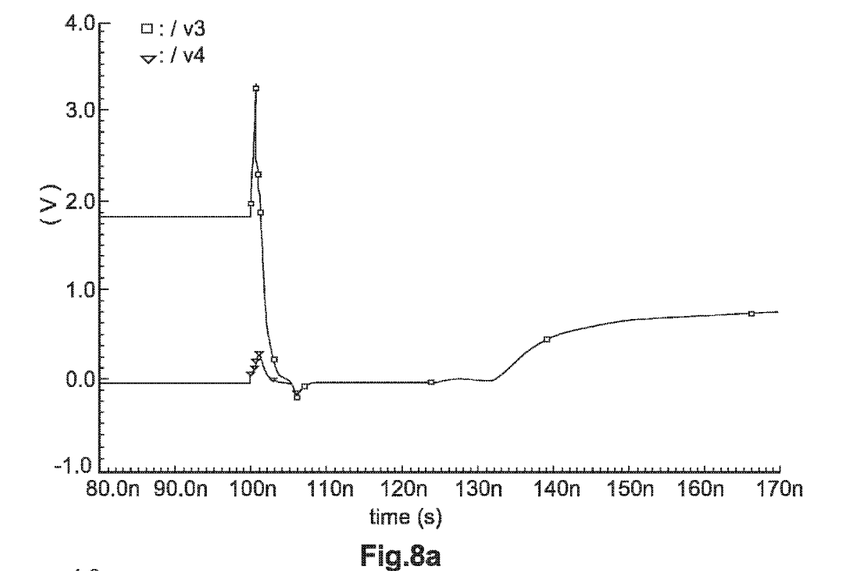
FIG. 8a shows the simulation results for the voltages $V_3$ at $V_4$ at the output of the folded cascode stage of the comparator when the first preferred embodiment of the invention is not implemented.
Figure 8B:
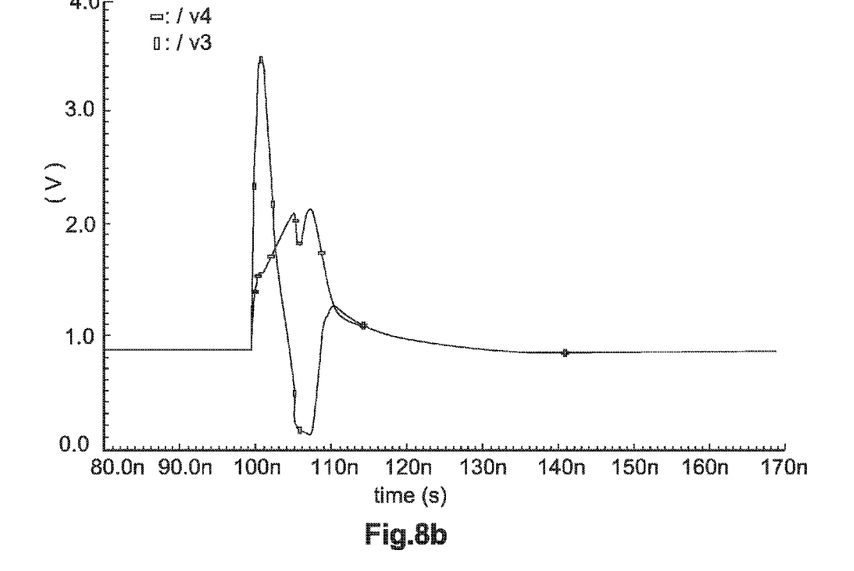
FIG. 8b shows the simulation results for the voltages $V_3$ at $V_4$ at the output of the folded cascode stage of the comparator when the first preferred embodiment of the invention is implemented.

In the same way, the comparison between FIG. 8a and FIG. 8b reveals that the potential nodes at $V_3$ and $V_4$ need a resettling time of about 50 ns without P3 and P4, which can be reduced to only 30 ns or less with P3 and P4.

It is noted that the invention such as described according to the first preferred embodiment can be applied to detect not only a zero current in a step-up DC-DC converter (LXB, OUT) but also a peak current in a step-down DC-DC converter (LXB, OUT). Moreover, after changing the polarity of the transistors P3, P4 of the invention according to the first preferred embodiment from P-channel transistors into N-channel transistors, and in the same way, the polarity of all the components in the comparator, the invention can also be applied to a second preferred embodiment to detect a peak current in a step-up DC-DC converter (LXB, $V_{ss}$) and a zero current in a step-down DC-DC converter (LXB, $V_{ss}$).

Furthermore, it is also noted that the input terminals of the comparator may be connected to the terminals of a DC-DC converter means such as step-up (boost) DC-DC converter or a step-down (buck) DC-DC converter or any combination of such DC-DC converters, which appropriately allows to detect a zero or peak current.

In summary, a simple and small-sized circuit configuration 10 for significantly reducing resettling time of a peak or zero current comparator has been described. This circuit configuration 10 provides the comparator input stage with an alternative current path at the comparator input submitted to a large voltage variation able to disturb the DC-settings. This circuit configuration 10 comprises a pair of small transistors (P3, P4) coupled to a differential pair of transistors (N1, N2) of the comparator input stage and having a polarity different from said pair of transistors (P3, P4). The gates of the transistors P3 and P4 share a common terminal connected to said comparator input. The currents and voltages across the comparator are always maintained close to the normal DC-setting values during the voltage transition phase. This circuit configuration 10 can be used in any comparator for detecting a peak or a zero current, in particular, in DC-DC converters based on a switched operating mode.

Finally but yet importantly, it is noted that the term "comprises" or "comprising" when used in the specification including the claims is intended to specify the presence of stated features, means, steps or components, but does not exclude the presence or addition of one or more other features, means, steps, components or group thereof. Further, the word "a" or "an" preceding an element in a claim does not exclude the presence of a plurality of such elements. Moreover, any reference sign does not limit the scope of the claims.

The invention claimed is:

1. A circuit configuration for reducing resettling time of a current detector means, said circuit configuration comprising: a differential pair of transistors including a first transistor which is coupled between a second node and a third node, wherein said first transistor receives a first input signal of a predetermined value at a first node, and a second transistor which is coupled between said third node and a fifth node, wherein said second transistor receives a second input signal of a variable value at a fourth node, said variable value being able to make a large shift relative to said predetermined value; a pair of transistors with a polarity different from said differential pair of transistors, including a third transistor which is coupled between said second node and said third node, and a fourth transistor which is coupled between said third node and said fifth node, wherein said third transistor and said fourth transistor share a common input terminal which is connected to said fourth node.

2. The circuit configuration according to claim 1, wherein said pair of transistors is a pair of relatively small-sized transistors.

3. The circuit configuration according to claim 1, wherein said transistors are metal oxide semiconductor field effect transistors or bipolar junction transistors.

4. The circuit configuration according to claim 3, wherein said variable value turns off said second transistor and turns on said fourth transistor or inversely.

5. The circuit configuration according to claim 4, wherein said variable value and said predetermined value are provided by a DC-DC converter means based on a switched operating mode, said DC-DC converter means being a step-up DC-DC converter or a step-down DC-DC converter or any combination of such DC-DC converters.

6. A comparator input stage for setting DC-setting values and reducing resettling time, said comparator input stage comprising at least: a circuit configuration according to claim 1; a first load which is coupled to said second node; a second load which is coupled to said fifth node; a current source which is coupled to said third node.

7. A comparator means for measuring a peak or zero current, said comparator means comprising at least: an input stage according to claim 6; an output stage for outputting a signal to a driver means, said driver means controlling an ON-OFF switching sequence; optionally, a cascode stage or a folded cascode stage being located between said input stage and said output stage for reducing the Miller capacitance effect.

8. A detector means for detecting a peak or zero current, said detector means comprising at least a comparator means according to claim 7.

* * * * *